US006803645B2

(12) United States Patent
Paek

(10) Patent No.: US 6,803,645 B2
(45) Date of Patent: Oct. 12, 2004

(54) SEMICONDUCTOR PACKAGE INCLUDING FLIP CHIP

(75) Inventor: Jong Sik Paek, Kwangju-shi (KR)

(73) Assignee: Amkor Technology, Inc., Chandler, AZ (US)

( * ) Notice: Subject to any disclaimer, the term of this patent is extended or adjusted under 35 U.S.C. 154(b) by 63 days.

(21) Appl. No.: 10/034,656

(22) Filed: Dec. 26, 2001

(65) Prior Publication Data

US 2002/0084534 A1 Jul. 4, 2002

(30) Foreign Application Priority Data

Dec. 29, 2000 (KR) .......................................... 2000-86246

(51) Int. Cl.[7] ........................................... H01L 23/495
(52) U.S. Cl. ..................................................... 257/666
(58) Field of Search ................................. 257/666, 673, 257/698, 777–780, 784, 786–788, 795; 438/123, 108, 612, 614

(56) References Cited

U.S. PATENT DOCUMENTS

| | | |
|---|---|---|
| 3,838,984 A | 10/1974 | Crane et al. |
| 4,054,238 A | 10/1977 | Lloyd et al. |
| 4,530,152 A | 7/1985 | Roche et al. |
| 4,707,724 A | 11/1987 | Suzuki et al. |
| 4,756,080 A | 7/1988 | Thorp, Jr. et al. |
| 4,812,896 A | 3/1989 | Rothgery et al. |
| 5,041,902 A | 8/1991 | McShane |
| 5,157,480 A | 10/1992 | McShane et al. |
| 5,172,213 A | 12/1992 | Zimmerman |
| 5,172,214 A | 12/1992 | Casto |
| 5,200,362 A | 4/1993 | Lin et al. |
| 5,200,809 A | 4/1993 | Kwon |
| 5,214,845 A | 6/1993 | King et al. |
| 5,216,278 A | 6/1993 | Lin et al. |
| 5,221,642 A | 6/1993 | Burns |
| 5,258,094 A | 11/1993 | Furui et al. |
| 5,273,938 A | 12/1993 | Lin et al. |

(List continued on next page.)

FOREIGN PATENT DOCUMENTS

| | | |
|---|---|---|
| DE | 19734794 A1 | 8/1997 |
| EP | 0794572 A2 | 10/1997 |
| JP | 575959 | 3/1982 |
| JP | 59227143 | 12/1984 |
| JP | 60195957 | 10/1985 |
| JP | 6139555 | 2/1986 |
| JP | 629639 | 1/1987 |
| JP | 63205935 | 8/1988 |
| JP | 63233555 | 9/1988 |
| JP | 1106456 | 4/1989 |
| JP | 692076 | 4/1994 |
| JP | 7312405 | 11/1995 |
| JP | 8125066 | 5/1996 |
| JP | 8306853 | 11/1996 |
| JP | 98205 | 1/1997 |
| JP | 98206 | 1/1997 |
| JP | 998207 | 1/1997 |
| JP | 992775 | 4/1997 |
| KR | 941979 | 1/1994 |
| KR | 9772358 | 11/1997 |

Primary Examiner—Hung Vu
(74) Attorney, Agent, or Firm—Stetina Brunda Garred & Brucker

(57) ABSTRACT

A semiconductor package comprising a plurality of leads. Each of the leads defines opposed first and second surfaces. Also included in the semiconductor package is a semiconductor chip which defines opposed first and second surfaces, and includes a plurality of input/output pads disposed on the first surface thereof. A plurality of conductive bumps are used to electrically connect the input/output pads of the semiconductor package to the second surfaces of respective ones of the leads. An encapsulant portion of the semiconductor package covers the semiconductor chip, the conductive bumps, and the second surfaces of the leads such that at least portions of the first surfaces of the leads are exposed within the encapsulant portion.

16 Claims, 2 Drawing Sheets

U.S. PATENT DOCUMENTS

| | | |
|---|---|---|
| 5,277,972 A | 1/1994 | Sakumoto et al. |
| 5,278,446 A | 1/1994 | Nagaraj et al. |
| 5,279,029 A | 1/1994 | Burns |
| 5,332,864 A | 7/1994 | Liang et al. |
| 5,336,931 A | 8/1994 | Juskey et al. |
| 5,343,076 A | 8/1994 | Katayama et al. |
| 5,406,124 A | 4/1995 | Morita et al. |
| 5,424,576 A | 6/1995 | Djennas et al. |
| 5,435,057 A | 7/1995 | Bindra et al. |
| 5,474,958 A | 12/1995 | Djennas et al. |
| 5,521,429 A | 5/1996 | Aono et al. |
| 5,604,376 A | 2/1997 | Hamurgen et al. |
| 5,608,267 A | 3/1997 | Mahulikar et al. |
| 5,639,990 A | 6/1997 | Nishihara et al. |
| 5,640,047 A | 6/1997 | Nakashima |
| 5,641,997 A | 6/1997 | Ohta et al. |
| 5,646,831 A | 7/1997 | Manteghi |
| 5,650,663 A | 7/1997 | Parthasarathi |
| 5,683,806 A | 11/1997 | Sakumoto et al. |
| 5,696,666 A | 12/1997 | Miles et al. |
| 5,701,034 A | 12/1997 | Marrs |
| 5,710,064 A | 1/1998 | Song et al. |
| 5,736,432 A | 4/1998 | Mackessy |
| 5,776,798 A | 7/1998 | Quan et al. |
| 5,783,861 A | 7/1998 | Son |
| 5,835,988 A | 11/1998 | Ishii |
| 5,859,471 A | 1/1999 | Kuraishi et al. |
| 5,866,939 A * | 2/1999 | Shin et al. .................. 257/666 |
| 5,877,043 A | 3/1999 | Alcoe et al. |
| 5,894,108 A | 4/1999 | Mostafazadeh et al. |
| 5,969,426 A * | 10/1999 | Baba et al. .................. 257/778 |
| 5,977,613 A | 11/1999 | Takata et al. |
| 5,977,630 A | 11/1999 | Woodworth et al. |
| 5,981,314 A | 11/1999 | Glenn et al. |
| 5,986,885 A | 11/1999 | Wyland |
| 6,001,671 A | 12/1999 | Fjelstad |
| 6,025,640 A | 2/2000 | Yagi et al. |
| 6,072,228 A | 6/2000 | Hinkle et al. |
| 6,130,115 A | 10/2000 | Okumura et al. |
| 6,130,473 A | 10/2000 | Mostafazadeh et al. |
| 6,140,154 A | 10/2000 | Hinkle et al. |
| 6,143,981 A | 11/2000 | Glenn |
| 6,225,146 B1 | 5/2001 | Yamaguchi et al. |
| 6,229,200 B1 | 5/2001 | Mclellan et al. |
| 6,242,281 B1 | 6/2001 | Mclellan et al. |
| 6,281,568 B1 | 8/2001 | Glenn et al. |
| 6,294,100 B1 | 9/2001 | Fan et al. ..................... 216/14 |

\* cited by examiner

SEMICONDUCTOR PACKAGE INCLUDING FLIP CHIP

CROSS-REFERENCE TO RELATED APPLICATIONS

The present application claims priority to Korean Patent Application No. 2000-86246 entitled SEMICONDUCTOR PACKAGE filed Dec. 29, 2000.

STATEMENT RE: FEDERALLY SPONSORED RESEARCH/DEVELOPMENT (Not Applicable)

BACKGROUND OF THE INVENTION

1. Field of the Invention

The present invention relates generally to semiconductor packages, and more particularly to a semiconductor package which includes a flip chip and is specifically configured to provide a thinner profile and superior moisture resistance capabilities as compared to flip chip semiconductor packages known in the prior art.

2. Description of the Related Art

The recent trend in the electronics industry has been toward the fabrication of lighter, thinner, more simplistic and miniaturized semiconductor packages. To achieve these objectives, there has been developed semiconductor packages fabricated through the use of a flip chip bonding method wherein a semiconductor chip is electrically connected to a printed circuit board component of the package. In this flip chip bonding method, the semiconductor chip is bonded to predetermined regions of the printed circuit board component through a reflow process subsequent to the orientation of an active surface of the semiconductor chip toward the printed circuit board component. The flip chip bonding method is used as an alternative to a conventional wire bonding method wherein conductive wires are used to facilitate the electrical connection of the input and output pads of a die to a lead frame.

However, currently known semiconductor packages fabricated using the flip chip bonding method described above possess certain deficiencies which detract from their overall utility. More particularly, since such semiconductor package employs a printed circuit board component which is costly, the manufacturing cost of the entire semiconductor package is itself significantly increased. In this regard, the cost of the printed circuit board component is extremely high due to the complexity of its manufacturing process, with the printed circuit board component accounting for more than sixty percent of the total cost of the semiconductor package employing the same. As indicated above, this high cost of the printed circuit board component results in an increased cost in the semiconductor package.

Another drawback associated with the printed circuit board component is that the same typically includes a resin layer and a solder mask which each have high water absorptivity. The susceptibility of the resin layer and solder mask to high levels of water absorption causes the semiconductor package to have a low level of resistance to moisture. As a result, the life span of the semiconductor package is drastically shortened when the same is used in regions of high humidity. A further problem pertains to the conductive balls which are fused to the bottom surface of the printed circuit board component of the semiconductor package. In this regard, the conductive balls are typically thicker than the semiconductor package itself, thus resulting in a significant increase in the overall thickness of the semiconductor package assembly including the conductive balls. The present invention overcomes these and other deficiencies of prior art semiconductor packages fabricated through the use of a flip chip bonding method, as will be discussed in more detail below.

BRIEF SUMMARY OF THE INVENTION

In accordance with the present invention, there is provided a semiconductor package comprising a lead frame which includes a plurality of leads. Each of the leads defines opposed, generally planar first and second surfaces. Each of the leads is preferably half-etched so as to further define a third surface which is formed between the first and second surfaces thereof. The semiconductor package also includes a semiconductor chip which defines opposed first and second surfaces, and includes a plurality of input/output pads disposed on the first surface thereof. The input/output pads of the semiconductor chip are electrically connected to the second surfaces of respective ones of the leads via a plurality of conductive bumps. Formed on a prescribed region of the second surface of each lead is a bump land to which the corresponding conductive bump is preferably fused. Additionally, preferably applied to the entirety of the second surface of each lead with the exception of that portion or region thereof defining the bump land is a protective layer. In the semiconductor package, the semiconductor chip, the conductive bumps, and the second and third surfaces of the leads are covered by a hardened encapsulant portion. The first surfaces of the leads are exposed within the encapsulant portion so as to define input/output terminals of the semiconductor package.

The structural attributes of the present semiconductor package impart thereto the ability to withstand severe environments for prolonged durations of time. In this regard, the structure of the present semiconductor package provides substantial moisture resistance characteristics. In addition, the input/output terminals defined by the exposed first surfaces of the leads can be mounted directly to an external device such as a motherboard, thereby minimizing the thickness of the semiconductor package/motherboard assembly. The configuration of the lead frame used in the manufacture of the present semiconductor package further minimizes the cost associated with the fabrication thereof.

The present invention is best understood by reference to the following detailed description when read in conjunction with the accompanying drawings.

BRIEF DESCRIPTION OF THE DRAWINGS

These, as well as other features of the present invention, will become more apparent upon reference to the drawings wherein.

Common reference numerals are used throughout the drawings and detailed description to indicate like elements.

DETAILED DESCRIPTION OF THE INVENTION

Figure 1:
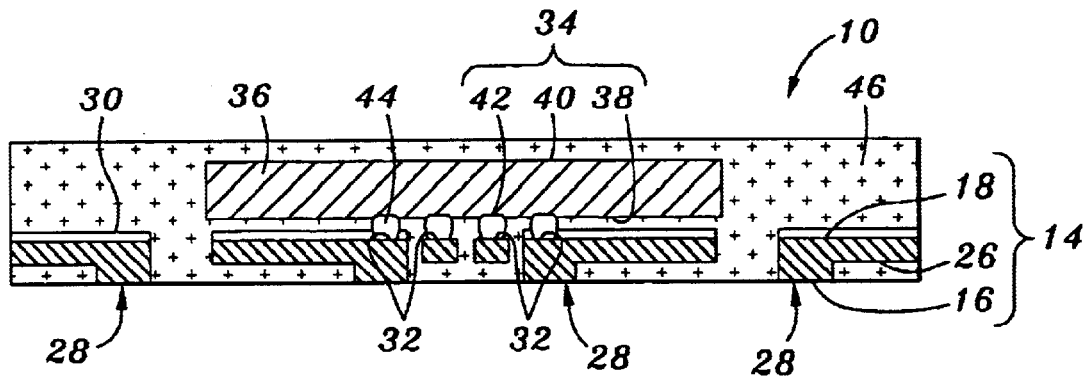
FIG. 1 is a cross-sectional view of a semiconductor package constructed in accordance with the present invention.
Figure 2:
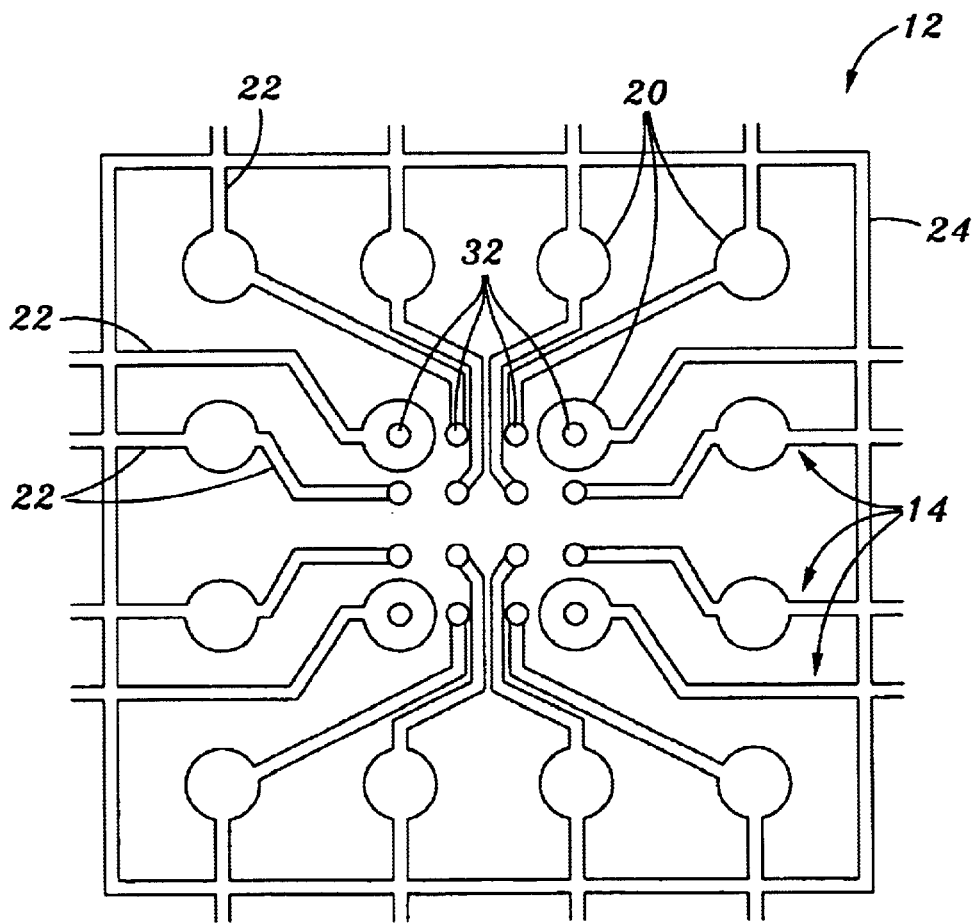
FIG. 2 is a top plan view of the lead frame included in the semiconductor package shown in FIG. 1.

Referring now to the drawings wherein the showings are for purposes of illustrating a preferred embodiment of the present invention only, and not for purposes of limiting the same, FIG. 1 illustrates in cross section a semiconductor package 10 constructed in accordance with the present invention. The semiconductor package 10 includes a lead frame 12 which is shown in FIG. 2. The lead frame 12 includes a plurality of leads 14, each of which defines a generally planar first (bottom) surface 16 and an opposed, generally planar second (top) surface 18. Each of the leads 14 further defines a circularly configured pad portion 20 and at least one elongate connecting bar portion 22 integrally connected to and extending from the pad portion 20. The leads 14 are arranged within the lead frame 12 such that the pad portions 20 are segregated into an outer set of twelve pad portions 20 which are arranged in a generally square pattern and an inner set of four pad portions 20 which are located within the outer set and also arranged in a generally square pattern. The pad portions 20 of the outer set each include a pair of connecting bar portions 22 extending therefrom, with one of the connecting bar portions 22 extending to a dambar 24 of the lead frame 12. The pad portions 20 of the inner set include only a single connecting bar portion 22 extending therefrom which also extends and is integrally connected to the dambar 24. As will be recognized, the dambar 24 is used to support the leads 14 within the lead frame 12 and, as is apparent from FIG. 1, is removed during the process of fabricating the semiconductor package 10. Those of ordinary skill in the art will recognize that the lead frame 12 may be fabricated to include greater or fewer than twelve leads 14, which also may be arranged in alternative patterns.

Figure 3A:
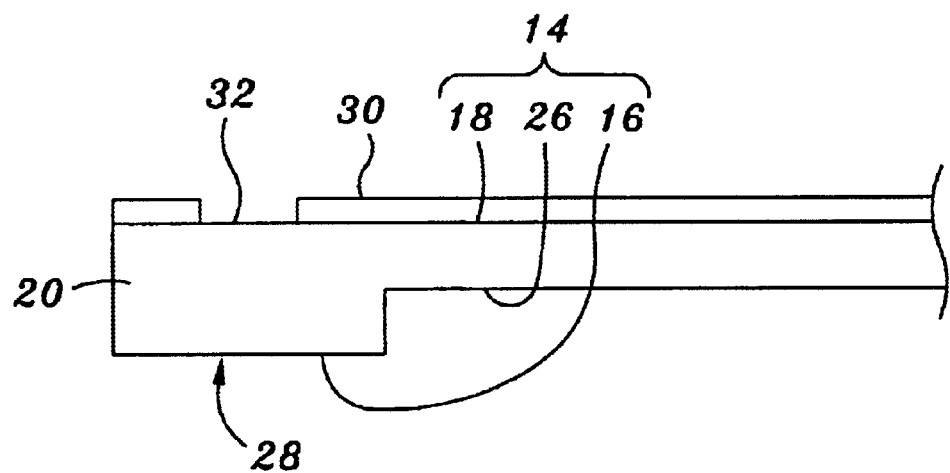
FIG. 3A is a side-elevational view of a portion of the lead frame shown in FIG. 2.
Figure 3B:
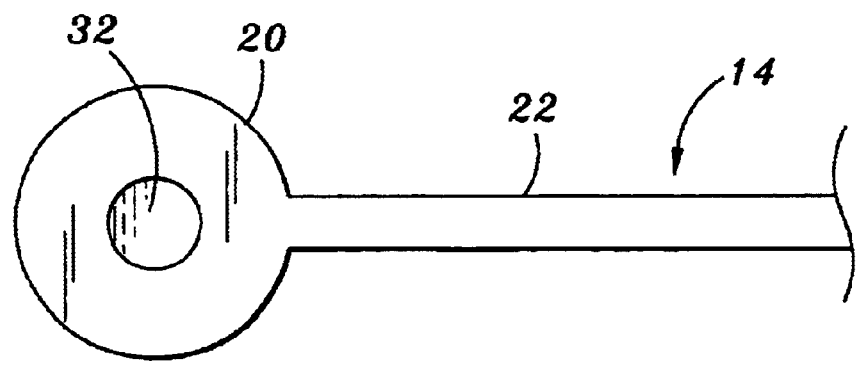
FIG. 3B is a top plan view of a portion of the lead frame shown in FIG. 2.

In the semiconductor package 10 of the present invention, the leads 14 are not of uniform thickness. Rather, each of the leads 14 is formed to include a third surface 26 which is perpendicularly offset from the first surface 16. Thus, the third surface 26 extends along a plane which is disposed between, and is generally parallel to, the planes along which the first and second surfaces 16, 18 extend. As best seen in FIGS. 1 and 3A, the third surfaces 26 of the leads 14 are preferably disposed in opposed relation to those sections or portions of the second surfaces 18 which extend along the connecting bar portions 22. Thus, the connecting bar portions 22 of the leads 14 are of a reduced thickness relative to the pad portions 20 thereof. The third surfaces 26 of the leads 14 may be formed by chemically half-etching the lead frame 12, or through the use of alternative methods. The half-etching will occur on those portions of the first surfaces 16 extending along the connecting bar portions 22, and not those portions extending along the pad portions 20. As further seen in FIG. 3A, those non-etched portions of the first surfaces 16 extending along the pad portions 20 each define an output terminal 28 of the semiconductor package 10. The lead frame 12 (and hence the leads 14) is preferably fabricated from copper, iron, or a copper alloy, as is generally known in the art.

Referring now to FIGS. 1, 2, 3A and 3B, the second surface 18 of each lead 14 preferably includes a protective layer 30 of a predetermined thickness formed thereon. Additionally, included on the second surface 18 of each lead 14 of the inner set in the approximate center of the pad portion 20 thereof is a bump land 32. A bump land 32 is also formed on each second surface 18 at the innermost end of the connecting bar portion 22 extending from a respective one of the pad portions 20 of the outer set. Thus, as seen in FIG. 2, a total of sixteen bump lands 32 are included on the lead frame 12 and arranged in a four-by-four matrix, the corners of which are defined by the bump lands 32 included on the pad portions 20 of the inner set.

The semiconductor package 10 of the present invention further comprises a semiconductor chip 34 (i.e., a flip chip). The semiconductor chip 34 comprises a body 36 defining a generally planar first (bottom) surface 38 and an opposed, generally planar second (top) surface 40. Formed on the first surface 38 are a plurality of input/output pads 42. Each of the input/output pads 42 is electrically connected to a respective one of the bump lands 32 by a conductive bump 44. Each conductive bump 44 is preferably fabricated by a conductive material such as gold, silver, solder, or their equivalents. As shown in FIGS. 1 and 2, the bump lands 32 included on the pad portions 20 of the inner set are in direct alignment with the input/output terminals 28 defined by the pad portions 20 of the inner set. As a result, their may be difficulty in fusing the conductive bumps 44 to the bump lands 32 included on the pad portions 20 of the inner set attributable to an excessive size of such bump lands 32. For this reason, the protective layer 30 is included on the second surface 18 of each lead 14, with the protective layer 30 being formed to be of a predetermined thickness and to maintain a predetermined region of each bump land 32 in a substantially circular configuration. That is, the protective layer 30 serves to prevent each conductive bump 44 from excessively overflowing along the second surface 18 of each lead 14. The protective layer 30 may be formed on the second surface 18 of each lead 14 at only the vicinity of the corresponding bump land 32, or may be formed to cover the entire second surface 18 of each lead 14 except at the corresponding bump land 32. The protective layer 30 may be fabricated from a conductive or non-conductive material such as aluminum, titanium, or polyimide. However, those of ordinary skill in the art will recognize that the protective layer 30 is not intended to be limited to any particular material.

As further seen in FIG. 1, in the semiconductor package 10 of the present invention, the semiconductor chip 34, the conductive bumps 44, and the leads 14 (with the exception of those portions of the first surfaces 16 defining the input/output terminals 28 and the outermost ends of certain connecting bar portions 22) are covered or encapsulated by an encapsulant 46 in order to protect the same from the external environment. The encapsulant 46 may be any one of an epoxy molding compound, a liquified glop top or its equivalent, with the present invention not being limited to any particular material. In the semiconductor package 10, the third surfaces 26 of the leads 14 are covered by and thus located within the hardened encapsulant 46. As a result, the third surfaces 26 serve to strengthen the adhesion of the encapsulant 46 to the covered or encapsulated components/surfaces of the semiconductor package 10, and prevent movement of the leads 14 within the encapsulant 46 or separation of the leads 14 therefrom. As indicated above, those portions of the first surfaces 16 of the leads 14 defining the input/output terminals 28 are exposed within the bottom surface of the hardened encapsulant 46 in order to provide subsequent mounting or electrical connection of the semiconductor package 10 to an external device (not shown). The semiconductor package 10 of the present invention is adapted to withstand severe environments for a prolonged duration of time due to the high resistance thereof to moisture. In addition, the input/output terminals 28 can be directly mounted to an external device such as a motherboard, thus resulting in a reduction in the thickness of the semiconductor package 10.

This disclosure provides exemplary embodiments of the present invention. The scope of the present invention is not limited by these exemplary embodiments. Numerous variations, whether explicitly provided for by the specification or implied by the specification, such as variations in structure, dimension, type of material or manufacturing process may be implemented by one of skill in the art in view of this disclosure.

What is claimed is:

1. A semiconductor package comprising:
a plurality of leads, each of the leads defining first and second surfaces and including:
 a pad portion; and
 at least one connecting bar portion integrally connected to and extending from the pad portion;
 at least some of the leads each having a bump land formed on the second surface upon the pad portion thereof and at least some of the leads each having a bump land formed on the second surface upon the connecting bar portion thereof,
 the pad portions of the leads being segregated into an outer set and an inner set, with the pad portions of the inner set each including a bump land formed thereon and the at least one connecting bar portion extending from each of the pad portions of the outer set defining an inner end having a bump land formed thereon, the inner ends of at least some of the connecting bar portions being positioned within an internal region defined by the inner set of pad portions;
a semiconductor chip defining opposed first and second surfaces and including a plurality of input/output pads disposed on the first surface thereof;
a plurality of conductive bumps electrically connecting the input/output pads to respective ones of the bump lands; and
an encapsulant portion covering the semiconductor chip, the conductive bumps, and the second surfaces of the leads such that at least portions of the first surfaces of the leads are exposed within the encapsulant portion.

2. The semiconductor package of claim 1 wherein the first surface of the semiconductor chip is disposed at a prescribed separation distance from the second surfaces of the leads.

3. The semiconductor package of claim 1 wherein:
the first and second surfaces of each of the leads are generally planar and extend in opposed relation to each other;
each of the leads further includes a third surface formed between the first and second surfaces thereof;
the third surface of each of the leads is covered by the encapsulant portion; and
the first surface of each of the leads is exposed within the encapsulant portion to serve as an input/output terminal.

4. The semiconductor package of claim 1 wherein each of the leads includes a protective layer formed on the second surface thereof other than for a prescribed region defining the bump land.

5. The semiconductor package of claim 4 wherein the protective layer is selected from the group consisting of:
a polyimide;
titanium; and
aluminum.

6. The semiconductor package of claim 1 wherein:
the first and second surfaces of each of the leads are generally planar and extend in opposed relation to each other;
each of the leads further includes a third surface formed between the first and second surfaces thereof in opposed relation to that segment of the second surface which extends along the connecting bar portion;
the third surface of each of the leads is covered by the encapsulant portion; and
the first surface of each of the leads extending along the pad portion thereof is exposed within the encapsulant portion to serve as an input/output terminal.

7. The semiconductor package of claim 1 wherein the plurality of input/output pads disposed on the first surface of the semiconductor chip are positioned directly above the bump lands formed on the pad portions of the inner set and the bump lands formed on the inner ends of the connecting bars positioned within the internal region.

8. The semiconductor package of claim 1 wherein all of the inners ends of the connecting bar portions are positioned within the internal region.

9. A semiconductor package comprising:
a plurality of leads, each of leads defining first and second surfaces and including:
 a pad portion;
 at least one connecting bar portion integrally connected to and extending from the pad portion;
 a protective layer formed on the second surface; and
 a bump land formed on the second surface and at least partially circumvented by the protective layer;
 at least some of leads each having the bump land formed on the pad portion thereof and at least some of the leads each having the bump land formed on the connecting bar portion thereof,
 the pad portions of the leads being segregated into an outer set and an inner set, with the pad portions of the inner set each including a bump land formed thereon and the at least one connecting bar portion extending from each of the pad portions of the outer set defining an inner end having a bump land formed thereon, the inner ends of at least some of the connecting bar portions being positioned within an internal region defined by the inner set of pad portions;
a semiconductor chip having a plurality of input/output pads disposed thereon;
a plurality of conductive bumps electrically connecting the input/output pads to respective ones of the bump lands; and
an encapsulant portion covering the semiconductor chip, the conductive bumps, and the leads such that at least a portion of the first surface of each of the leads is exposed in the encapsulant portion.

10. The semiconductor package of claim 9 wherein the semiconductor chip has a first surface which is disposed at a prescribed separation distance from the second surfaces of the leads.

11. The semiconductor package of claim 9 wherein:
the first and second surfaces of each of the leads are generally planar and extend in opposed relation to each other;
each of the leads further includes a third surface formed between the first and second surfaces thereof; and
the third surface of each of the leads is covered by the encapsulant portion.

12. The semiconductor package of claim 9 wherein the protective layer comprises one of polyimide, titanium and aluminum.

13. The semiconductor package of claim 9 wherein:

the first and second surfaces of each of the leads are generally planar and extend in opposed relation to each other;

each of the leads further includes a third surface formed between the first and second surfaces thereof in opposed relation to a segment of the second surface which extends along the connecting bar portion;

the third surface of each of the leads is covered by the encapsulant portion; and the first surface of each of the leads extending along the pad portion thereof is exposed in the encapsulant portion.

14. The semiconductor package of claim 9 wherein the pad portions and the bump lands each have a circular footprint.

15. The semiconductor package of claim 9 wherein the plurality of input/output pads disposed on the semiconductor chip are positioned directly above the bump lands formed on the pad portions of the inner set and the bump lands formed on the inner ends of the connecting bars positioned within the internal region.

16. The semiconductor package of claim 9 wherein all of the inners ends of the connecting bar portions are positioned within the internal region.

\* \* \* \* \*